(12) United States Patent
Miyauchi

(10) Patent No.: US 6,316,928 B1
(45) Date of Patent: *Nov. 13, 2001

(54) SPECTRUM ANALYZER

(75) Inventor: Kouji Miyauchi, Gyoda (JP)

(73) Assignee: Advantest Corp., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/264,754

(22) Filed: Mar. 9, 1999

(30) Foreign Application Priority Data

Mar. 18, 1998 (JP) .................................. 10-067972

(51) Int. Cl.$^7$ .................................. G01R 13/24
(52) U.S. Cl. .................................. 324/76.27
(58) Field of Search .................... 324/76.27, 76.26, 324/76.35, 76.77, 76.19, 76.23, 613, 622

(56) References Cited

U.S. PATENT DOCUMENTS 5,337,014 * 8/1994 Najle et al. ....................... 324/613

* cited by examiner

*Primary Examiner*—Safet Metjahic
*Assistant Examiner*—E P LeRoux
(74) *Attorney, Agent, or Firm*—Muramatsu & Associates

(57) ABSTRACT

A spectrum analyzer that incorporates a YTO (YIG tuned oscillator) as a sweep frequency local oscillator and a YTF (YIG tuned filter) as a frequency pre-selector for an incoming signal and improves a C/N (carrier to noise) ratio with low cost. The spectrum analyzer includes a YTO first local oscillator which is swept in response to a ramp signal, a base band block having a first frequency mixer for producing a first intermediate frequency (IF) signal and a second frequency mixer for producing a second IF signal, a high band block having a YTF frequency preselector for selecting frequency components in the input signal in response to the ramp signal and a high band frequency mixer for producing the second IF signal by mixing the input signal through the YTF with the first local signal, and a local signal mode switch for either directly providing the first local signal to the high band frequency mixer or through a frequency divider which divides the frequency of the first local signal by a predetermined division ratio. The YTO has a sweep frequency range which is 1/2 of a sweep frequency range of the YTF, and the division ratio of the frequency divider is two (2).

3 Claims, 6 Drawing Sheets

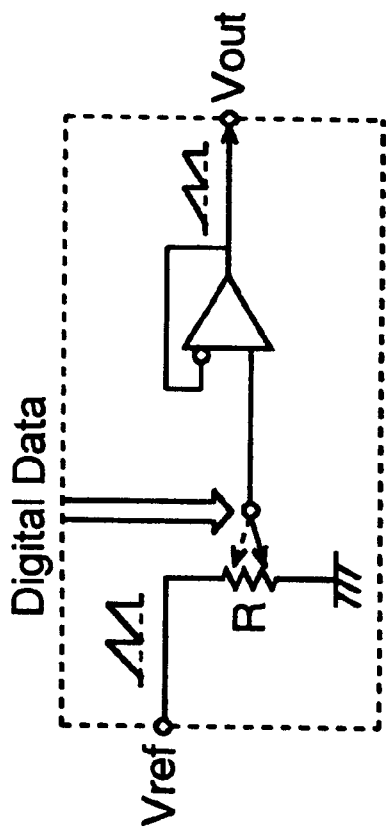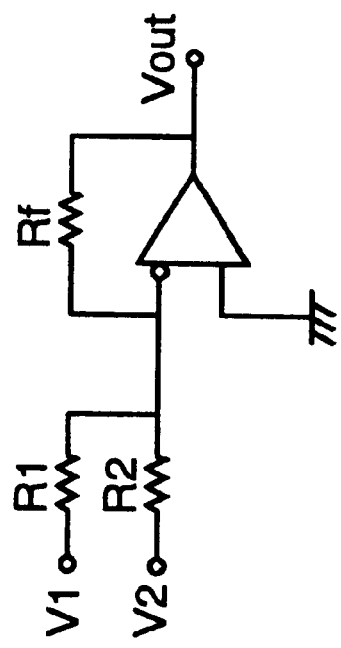
FIG.4A
FIG.4B

Fig. 6

|  | Input Freq | YTO Freq |
|---|---|---|
| Base Band | 0Hz ~ $f_{RF}$Hz | $f_{IF1}$Hz ~ ($f_{RF}$ + $f_{IF1}$)Hz |
| Hi Band | ($f_{LO}$ - $f_{IF2}$)Hz ~ (4$f_{LO}$ - $f_{IF2}$)Hz | $f_{LO}$Hz ~ 4$f_{LO}$Hz |

Fig. 7

|  | Input Freq | YTO Freq | 1/2 Mode |
|---|---|---|---|
| Base Band | 0Hz ~ $f_{RF}$Hz | $f_{L1}$Hz ~ ($f_{RF}$ - $f_{IF1}$)Hz | OFF |
| Hi Band | ($f_{LO}$ - $f_{IF2}$)Hz ~ (2$f_{LO}$ - $f_{IF2}$)Hz | 2$f_{LO}$Hz ~ 4$f_{LO}$Hz | ON |
| Hi Band | (2$f_{LO}$ - $f_{IF2}$)Hz ~ (4$f_{LO}$ - $f_{IF2}$)Hz | 2$f_{LO}$Hz ~ 4$f_{LO}$Hz | OFF |

SPECTRUM ANALYZER

FIELD OF THE INVENTION

This invention relates to a spectrum analyzer for analyzing frequency spectrum of an incoming signal and displaying the frequency spectrum on a frequency domain display. In particular, this invention relates to a spectrum analyzer that incorporates a YTO (YIG tuned oscillator) as a sweep frequency local oscillator and a YTF (YIG tuned filter) as a frequency preselector for an incoming signal.

BACKGROUND OF THE INVENTION

Frequency spectrum analyzers are frequently used for analyzing frequency spectrum in an input signal. Usually, such frequency spectrum is displayed on a frequency domain screen with a power level in a vertical direction while a frequency dispersion in a horizontal direction. Some spectrum analyzers, especially which can analyze higher frequency spectrum, incorporate a YIG tuned oscillator (YTO) as a local oscillator and a YIG tuned filter (YTF) as an input frequency preselector. Here, a YIG (Yttrium iron Garnet) is a high quality resonance element used in a high frequency band such as a microwave.

First, brief explanation is made regarding the YTO local oscillator and the YTF preselector. A YIG crystal is an element that magnetically resonates at a microwave frequency in response to intensity of a magnetic filed surrounding the crystal. By changing the direct current (DC) magnetic field, the resonance frequency of the YIG crystal changes linearly. The YIG crystal shows a wide range of frequency resonance which is controlled by a DC current (intensity of magnetic field) with excellent linearity. Further, the resonant characteristics of the YIG crystal has an excellent quality factor (Q) which is suitable for forming high quality oscillators and filters.

Therefore, a YTO is configured with use of a YIG crystal to establish a sweep frequency oscillator in a microwave frequency range. Since a frequency spectrum analyzer is required to analyze a wide frequency range of frequency spectrum, a YTO is advantageously incorporated as a local oscillator of the spectrum analyzer. Especially when a phase lock technology is applied to the high frequency oscillation signal of the YTO with use of a low frequency high stability crystal oscillator, such as a VCXO (voltage control crystal oscillator), it is possible to achieve a microwave sweep local oscillator of high signal purity.

As a frequency sweep range, a single octave bandwidth, such as from $f_{LO}$ to $2f_{LO}$ Hz or from $2f_{LO}$ to $4f_{LO}$ Hz is common as YTO local oscillators. In a typical YTO, the frequency $f_{LO}$ is about 2 GHz. Although double octave bandwidth from $f_{LO}$ to $4f_{LO}$ Hz is also available, such a YTO is usually expensive and difficult to manufacture with uniform quality.

A YTF is a sweep frequency band pass filter utilizing the property of the YIG crystal, in which a pass band frequency changes linearly in response to a DC voltage applied thereto. In the application of frequency preselectors in spectrum analyzers, it is relatively easy to achieve YTFs of double octave bandwidth from $f_{LO}$ to $4f_{LO}$ Hz.

In the frequency spectrum analysis using a frequency spectrum analyzer, an input signal to be tested by the spectrum analyzer often has many different frequency components (spectrum). In addition, the signal power level of such frequency components ranges from a high level to a low level. Thus, in the case where analyzing a frequency component (spectrum) of a low power level, other frequency component of a high power level may be included in the input signal. In such a situation, an input frequency mixer of a spectrum analyzer will be saturated by the high power level component, which makes it impossible to analyze the spectrum having the small power level.

Accordingly, in the spectrum analyzer, it is desirable to perform a frequency selection of frequency spectrum in the incoming signal by placing a band pass filter before the first mixer. A YTF is advantageously incorporated as a frequency preselector in the spectrum analyzer since it can change the pass band frequency through a wide frequency range with high linearity and selectivity.

Thus, the incoming signal can be preselected by the YTF when the frequency pass band of the YTF sweeps linearly in the microwave frequency range. The pass band frequency of the YTF preselector is the YTO frequency less an intermediate frequency $f_{IF}$ Hz. Here, the frequency $f_{IF}$ Hz is an intermediate frequency of an input frequency mixer, i.e., a sum or difference between the input signal frequency and the local oscillator (YTO) frequency. In the analysis of the low frequency range of the input signal, high frequency components are removed by a low pass filter provided at the input of the spectrum analyzer, thereby preventing the saturation of the frequency mixer.

A basic configuration of this type of frequency spectrum analyzer in the conventional technology is explained with reference to FIG. 3. In the example of FIG. 3, the spectrum analyzer includes a base band block 10 and a high band bock 20 which are selected by an input switch 6 and a local oscillator switch 8. A YTO (YIG tune oscillator) 7 is a first local sweep oscillator for the base band block 10 and the high band block 20 connected through the switch 8. The base band block 10 is comprised of a low pass filter 10, a first frequency mixer 12, an intermediate frequency (IF) band pass filter 13, a second frequency mixer 14, and a second local oscillator 15. The high band block 20 includes a YTF (YIG tune filter) 21 and a high band frequency mixer 22.

The spectrum analyzer of FIG. 3 further includes an IF switch 25, a third frequency mixer 27, a third local oscillator 27, a detector 28, an A/D (analog to digital) converter 29, a display 31, a ramp generator 30, DAC (digital to analog converters) 36 and 38, analog voltage adders 37 and 39, a span data generator 32, offset voltage generators 33 and 35, and a gain data generator 34.

In the base band block 10, the first frequency mixer 12 produces a first IF signal f53 having a frequency $f_{IF}1$ and the second frequency mixer 14 produces a second IF signal f54 having a frequency $f_{IF}2$. In the high band block 20, the high band frequency mixer 22 produces the second IF signal f54 with the IF frequency $f_{IF}2$. The second IF signal f54 (frequency $f_{IF}2$) from either the base band block 10 or the high band block 20 is received by the third frequency mixer 26 through the IF switch 25.

In this example, a frequency range of an input signal that can be tested by the spectrum analyzer is about 0 Hz to $16f_{LO}$ Hz by using a harmonics waves of the oscillation frequency of the YTO. However, for the simplicity of explanation, the operation concerning the input frequency ranging 0 Hz to ($4f_{LO}$ minus $f_{IF}2$)Hz using a fundamental frequency of the local oscillator (YTO) is described in the following. In this situation, the sweep frequency pass band of the YTF preselector 21 ranges from ($f_{LO}$ minus $F_{IF}2$) Hz to ($4F_{LO}$ minus $f_{IF}2$) Hz, and the sweep oscillator frequency of the local oscillator YTO 7 ranges from $f_{LO}$ Hz to $4f_{LO}$ Hz. An example of the first local frequency $f_{LO}$ is 2 GHz, and the first IF frequency $f_{IF}1$ is 2 GHz, and the second IF frequency $f_{IF}2$ is 0.4 GHz.

In order to drive the local oscillator YTO 7 and the preselector YTF 21, a ramp signal of, for example, ±5V is generated by the ramp generator (saw-tooth wave generator) 30. The ramp signal is branched out, and one is used for an X axis sweep of the display 31 and the other is supplied to a reference voltage ($V_{REF}$) terminal of the multiplying type DAC (digital to analog converter) 36. The frequency range (span) data from the span data generator (frequency range data generator) 32 is input to the digital data terminal of the multiplying type DAC 36.

The ramp wave and the frequency range data are multiplied, and a resultant analog ramp signal is produced at the output of the DAC 36. Thus, assuming that the input ramp signal is x, the frequency range data is a, and the output ramp signal is y, the relationship represented by y=ax is obtained by the DAC 36. By changing the value of a, the degree of slope of the ramp signal y also changes.

The simplest equivalent circuit of this multiplying type DAC 36 is shown in FIG. 4A. The ramp signal provided to the $V_{REF}$ terminal is modified by the digital data representing the span (frequency range) from the span generator 32, thereby producing an analog signal which is the product of the ramp signal and the span data at the output $V_{out}$ of the buffer amplifier. An example of the resistor R in FIG. 4A is a resistance ladder which changes a voltage division ratio of the ramp signal in response to the digital data (span data).

The output voltage of the multiplying type DAC 36 is added to the offset voltage from the offset voltage generator 33 by the analog voltage adder 37. An example of basic circuit structure of such an analog voltage adder is shown in FIG. 4B. The offset voltage defines the center frequency of the measurement frequency range (frequency span) in the spectrum analyzer. Hence, assuming that the offset voltage is b, the relationship described above now becomes y=ax+b. The voltage of the ramp signal from the multiplying type DAC 36 is ax, and the voltage of the center frequency is b. The output of the analog voltage adder 37 is provided to the YTO 7, by which a swept frequency local signal is generated.

The output of the analog voltage adder 37 is also provided to the multiplying type DAC 38 to produce a sweep signal to be supplied to the YTF 21. In the multiplying type DAC 38, the ramp signal, which is expressed by y=ax+b, from the analog adder 37 is multiplied by the gain data from the gain data generator 34. This process is to match the pass band frequency of the YTF 21 with the sweep oscillator frequency of the YTO 7. Since the frequency property of the YTF 21 and the frequency property of the YTO 7 can be different, this frequency difference must be canceled by the gain data noted above. Hence, the output of the DAC 38 show the relationship of y=a'x+b.

The output voltage of the multiplying type DAC 38 showing the relationship y=a'x+b is added to the offset voltage c from the offset voltage generator 35 by the analog voltage adder 39. The offset voltage c is provided to establish the frequency difference in the pass band frequency of the YTF 21 from the local oscillator frequency from the YTO 7. Because of the high band frequency mixer 22, the frequency of the input signal f52 to the YTF 21 should be different from the local oscillator frequency by the second IF signal frequency $f_{IF}2$. Thus, the offset voltage c is the voltage amount for causing the frequency difference $f_{IF}2$ in the tuning frequency of the YTF 21 from the local frequency of the YTO 7. In the above example, the second IF signal frequency $f_{IF}2$ is 0.4 GHz.

Such a frequency difference $f_{IF}2$ in the pass band frequency can be either added or subtracted from the local frequency $f_{LO}$. This relationship is expressed by the equation $f_{IF}2=(f_{LO}\pm f_{RF})$ where the $f_{IF}2$ is the second IF frequency, $f_{LO}$ is the YTO frequency, and $f_{RF}$ is the YTF pass band frequency, i.e., the input signal frequency. Thus, the drive voltage provided to the preselector YTF 21 is a voltage represented by y=a'x+b±c. It is a design choice whether the plus or minus in the above expression is selected. In this manner, the first local oscillator YTO 7 and the preselector YTF 21 are swept while tracking with each other by the ramp signal x in the above noted relationship.

The frequency spectrum analyzer receives an input signal f50 to be analyzed at the input terminal 5. The input signal f50 is allocated to either the base band block 10 or the high band block 20 by the input switch 6. The input frequency that can be analyzed through the base band block 10 is lower than the maximum oscillation frequency of the first local oscillator YTO 7. Thus, the input frequency for the base band block 10 is in the range of 0 Hz–$f_{RF}$ Hz where the reference $f_{RF}$ Hz designates the maximum input frequency.

The input frequency that can be analyzed through the high band block 20 corresponds to the tuning frequency (pass band frequency) of the preselector YTF 21. As noted above, the tuning frequency of the YTF is regulated by the drive voltage which is tracked with the local sweep voltage. The input frequency range in the high band block 20 extends, for example, from ($f_{LO}$ minus $f_{IF}2$) Hz to ($4f_{LO}$ minus $f_{IF}2$) Hz. The relationship between the input signal frequency and the first local frequency in the base band and high band blocks are shown in the table of FIG. 6.

As shown in the table of FIG. 6, in the base band block 10, the input frequency range is 0–$f_{RF}$ Hz, and the first local frequency range is from $f_{IF}1$ Hz to ($f_{RF}$ plus $f_{IF}1$) Hz. The high frequency components in the input signal are prevented by the low pass filter 10 from being provided to the first frequency mixer 12. The input signal is mixed with the first local signal f41 from the YTO 7 and is converted to the first IF (intermediate frequency) signal f53. The IF signal f53 at the output of the first frequency mixer 12 has the first IF frequency $f_{IF}1$ Hz. The first IF signal f53 is mixed with the second local signal at the second frequency mixer 15 and converted to the second IF signal f54. The second IF signal f54 at the output of the second frequency mixer 14 has a frequency $f_{IF}2$ Hz.

In the high band block 20, the YTO sweeps between $f_{LO}$ Hz and $4f_{LO}$ Hz for the input signal frequency ranging from ($f_{LO}$ minus $f_{IF}2$) Hz to ($4f_{LO}$ minus $f_{IF}2$) Hz. The local signal f42 from the YTO 7 is provided to the high band frequency mixer 22 through the local switch 8. The high band frequency mixer 22 converts the input signal f52 to the second IF signal f54 having the IF frequency $f_{IF}2$ Hz.

The second IF signal f54 from either the base band block 10 or the high band block 20 is mixed with the third local signal at the third frequency mixer 26, thereby producing the third IF signal f55 having a frequency $f_{IF}3$ Hz. The third IF signal f55 is amplitude detected by the detector 28 and is converted to the digital signal by the A/D converter 29. The digital data is supplied to the display 31 as the vertical data thereof. Thus, the amplitude (power level) of the frequency spectrum in the input signal is displayed on the display 31 relative to the frequency.

In the spectrum analyzer in the conventional technology of FIG. 3, when the filtering is conducted on the input signal by the preselector YTF 21 having the double octave band from ($f_{LO}$ minus $f_{IF}2$) Hz to ($4f_{LO}$ minus $f_{IF}2$) Hz, the local oscillator YTO 7 also needs to sweep a double octave band from $f_{LO}$ Hz to $4f_{LO}$ Hz. However, double octave YTOs are more expensive than the signal octave YTOs, and are difficult to manufacture with the same quality.

Further, in the high resolution spectrum analysis, a phase lock technology is used for the first local oscillator YTO to stabilize the frequency thereof. In such a phase lock technology, the frequency of the first local oscillator YTO is phase locked to a reference signal. The reference signal in such a situation is a harmonic frequency of a high precision oscillator such as a voltage controlled crystal oscillator (VCXO). For example, the harmonic frequency is a frequency of n times of the VCXO fundamental frequency $f_{VCXO}$ for the first local frequency $f_{LO}$ Hz. In the foregoing conventional technology, for the local frequency $4f_{LO}$ Hz, the harmonic frequency of 4n times of the VCXO fundamental frequency $f_{VCXO}$.

When the frequency is multiplied, a C/N (carrier to noise) ratio of the reference signal, such as derived from the VCXO, is deteriorate accordingly. A schematic illustration of the C/N ratio is shown in FIG. 2 in which a difference between the level of a carrier signal fc and a side band noise is shown as a C/N ratio. Since the frequency of four times higher must be used as a reference signal for phase locking the highest local frequency $4f_{LO}$ Hz, the resultant C/N ratio decreased by 12 dB compared with phase locking the lowest frequency $f_{LO}$ Hz.

SUMMARY OF THE INVENTION

Therefore, it is an object of the present invention to provide a spectrum analyzer which is capable of improving the carrier to noise (C/N) ratio with use of an inexpensive single octave YIG tuned oscillator (YTO).

It is another object of the present invention to provide a spectrum analyzer which is capable of analyzing the frequency spectrum of the input signal with low noise and high dynamic range.

It is a further object of the present invention to provide a spectrum analyzer which is capable of reducing the noise level of the local signal by incorporating a single octave YTO and dividing the frequency of the YTO.

In the spectrum analyzer of the present invention, the first local signal from the YTO is either directly provided to the high band frequency mixer or frequency divided before being provided to the frequency mixer. By this arrangement, the local signal supplied to the first frequency mixer has a frequency band equivalent to the double octave band YTO with use of the signal octave band YTO.

The spectrum analyzer of the present invention includes a first local oscillator comprised of a YIG tuned oscillator for generating a first local signal which is swept in response to a ramp signal, a base band block having a first frequency mixer for producing a first intermediate frequency (IF) signal by mixing the input signal to be analyzed with the first local signal and a second frequency mixer for producing a second IF signal by mixing the first IF signal with a second local signal, a high band block having a frequency preselector comprised of a YIG tuned filter (YTF) for selecting frequency components in the input signal in response to the ramp signal wherein the high band block also has a high band frequency mixer for producing the second IF signal by mixing the input signal through the YTF with the first local signal, and a local signal mode switch for either directly providing the first local signal to the high band frequency mixer or providing the first local signal to the high band frequency mixer through a frequency divider which divides the frequency of the first local signal by a predetermined division ratio.

According to the present invention, the spectrum analyzer is capable of improving the carrier to noise (C/N) ratio with use of a single octave YIG tuned oscillator (YTO) while decreasing the cost. Because of the improved C/N ratio, the spectrum analyzer of high dynamic range with low noise level is achieved. The noise level of the local signal is reduced by incorporating the single octave YTO and dividing the frequency of the YTO before being applied to the frequency mixer.

BRIEF DESCRIPTION OF THE DRAWINGS

FIG. 4A is a circuit diagram showing an example of basic structure of a multiplying type DAC (digital to analog converter).

FIG. 4B is a circuit diagram showing an example of basic structure of an analog voltage adder.

FIG. 6 is a table showing the frequency relationship between the input frequency to the spectrum analyzer and the first local frequency in the conventional spectrum analyzer of FIG. 3.

FIG. 7 is a table showing the frequency relationship between the input frequency to the spectrum analyzer and the first local frequency in the spectrum analyzer of the present invention.

DETAILED DESCRIPTION OF THE EMBODIMENTS

Figure 1:
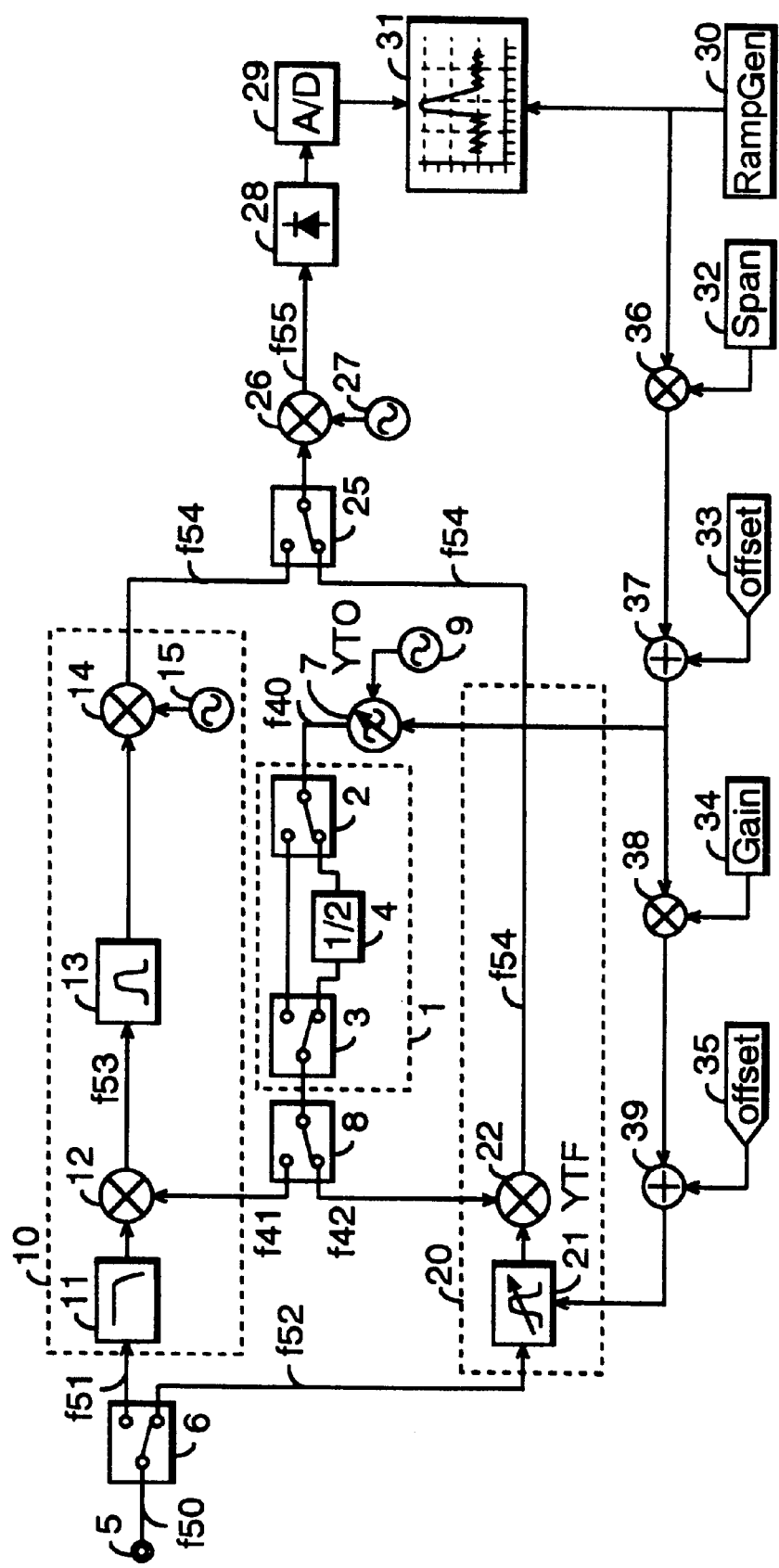
FIG. 1 is a block diagram showing an example of configuration in the spectrum analyzer of the present invention.

Preferred embodiment of the present invention is explained with reference to the drawings. FIG. 1 is a block diagram showing an example of configuration in the spectrum analyzer of the present invention. In this example, a local signal divider 1 is provided between the first local oscillator YTO 7 and the high band frequency mixer 22. The local signal divider 1 is formed of switches 2 and 3 (local signal mode switch), and a frequency divider 4.

In the local signal divider 1, two signal paths can be established by the operation of the switches 2 and 3 (local signal mode switch). One signal path is a direct path from the first local oscillator YTO 7 to the frequency mixer 22 (direct mode). The other is a signal path incorporating the frequency divider 4 for dividing the local signal frequency by two (2) to produce the 1/2 frequency (1/2 mode) in the first local signal. By operating the switches 2 and 3 simultaneously, the output frequency of the YTO 7 can be connected directly or with the frequency divided to 1/2 to the frequency mixer 22.

In this invention, a high frequency single octave frequency band from $2f_{LO}$ Hz to $4f_{LO}$ Hz is used for the first local oscillator YTO 7. The local signal from the YTO 7 is directly provided to the first frequency mixer 12 in the base band block 10. An example of the input frequency range of the base band block 10 is from 0 Hz to $2f_{LO}$ Hz where the first IF frequency $f_{IF}1$ is $2f_{LO}$ Hz.

The input frequency range in the high band block 20 is divided into two ranges. The lower input frequency range extends from ($f_{LO}$ minus $f_{IF}2$) Hz to ($2f_{LO}$ minus $f_{IF}2$) Hz while the higher frequency range extends from ($^2f_{LO}$ minus $f_{IF}2$) Hz to ($4f_{LO}$ minus $f_{IF}2$) Hz. In a typical implementation, the first local frequency $f_{LO}$ is 2 GHz, the first IF frequency $f_{IF}1$ is 4 GHz, and the second IF frequency $f_{IF}2$ is 0.4 HGz.

In the lower frequency range, the output frequency of the YTO 7 is divided by two (1/2 mode) before being supplied to the high band frequency mixer 22. In the higher frequency range, the output frequency of the YTO 7 is directly supplied to the frequency mixer 22. The relationships between the input signal frequency and the first local frequency in the base band block 10 and high band block 20 are shown in the table of FIG. 7.

As shown in the table of FIG. 7, the first local YTO 7 is a sweep local oscillator having the single octave band width from $2f_{LO}$ Hz to $4f_{LO}$ Hz. By the control of the 1/2 mode, the input signal can be preselected by the YTF which has the double octave bandwidth from ($f_{LO}$ minus $f_{IF}2$) Hz to ($4f_{LO}$ minus $f_{IF}2$) Hz. As noted above, the 1/2 mode is an operational mode in the high band block 20 wherein the output frequency of the first local oscillator YTO 7 is divided into half (½) which is applied to the high band frequency mixer 22 of the high band block 20.

Figure 2:
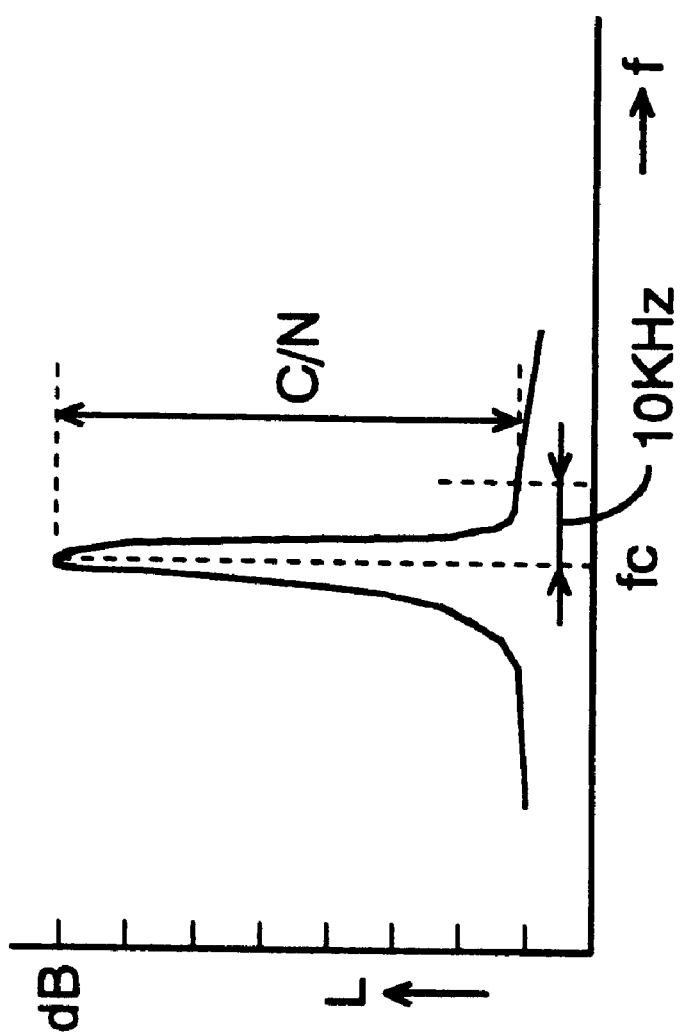
FIG. 2 is a schematic view showing an image of C/N (carrier to noise) ratio in a spectrum analyzer.
Figure 3:
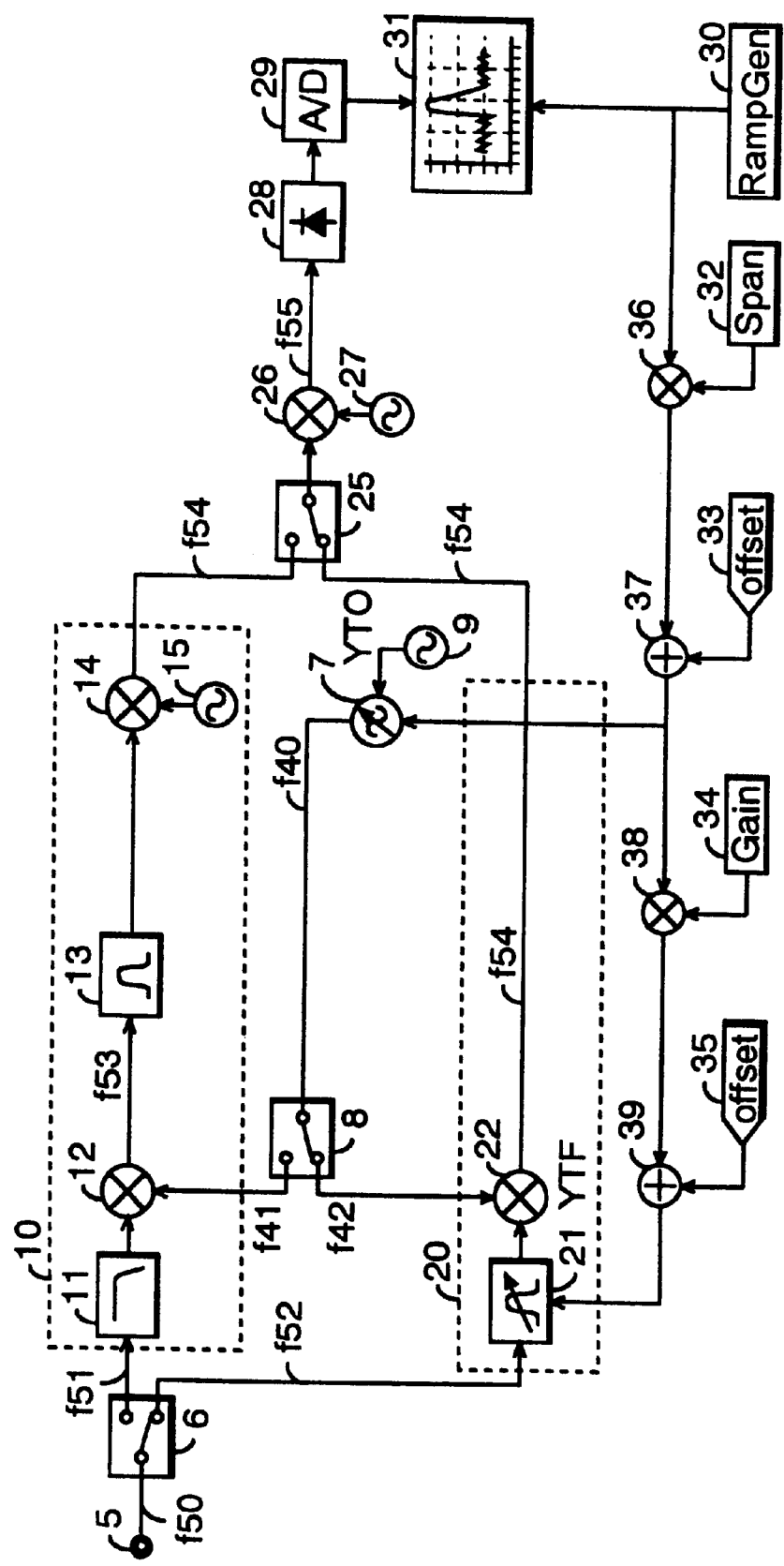
FIG. 3 is a block diagram showing a configuration of the spectrum analyzer in the conventional technology.

As stated above, when the frequency is multiplied, a C/N (carrier to noise) ratio of a reference signal, such as derived from a VCXO (voltage controlled crystal oscillator), is deteriorated accordingly. An example of the C/N ratio is shown in FIG. 2 in which a difference between a level of a carrier signal fc and a side band noise is shown as a C/N ratio. Similarly, when the frequency is divided, a C/N ratio of a signal improves in proportion to the division ratio.

The C/N ratio in the above arrangement of the present invention improves by 6 dB at the highest local frequency of the first local signal when it is phase locked by the reference signal from the VCXO. This is because the VCXO that provides the reference signal to the phase lock loop for the YTO can use the harmonics between n times and 2n times of the fundamental frequency of $2f_{VCXO}$ rather than the harmonics between n times and 4n times of the fundamental frequency of $f_{VCXO}$ in the conventional example. Moreover, in the 1/2 mode, the first local signal frequency of the YTO 7 is multiplied by ½ (divided into half). Thus, noise level in the first local signal received by the frequency mixer 22 is decreased by the division ratio, i.e., the C/N ratio improves by 6 dB. Thus, the overall C/N ratio is improved by 12 dB by the sum of 6 dB and 6 dB above.

As explained above, the spectrum analyzer of the present invention is realized in which the preselector made of YTF of the multi-octave band is used while the first sweep local oscillator YTO of the inexpensive single octave band is used by accompanying the local signal divider. The measurement dynamic range is substantially increased by improving the C/N ratio while the cost is reduced.

In the above embodiment, the local signal divider is arranged between the first local oscillator YTO 7 and the high band frequency mixer 22 in the high band block. In the 1/2 mode, the output frequency from the YTO 7 is divided by two to make the frequency half (½) of the original frequency before being applied to the frequency mixer 22 in the high band block 20.

However, the division ratio of the first local signal is not limited to 1/2. It is also possible to accommodate the division ratio of an arbitrary number n, i.e., to produce the first local signal of 1/n frequency. In this case as well, the spectrum analyzer is realized which increases the dynamic range by improving the dynamic range while reducing the overall cost.

Figure 5:
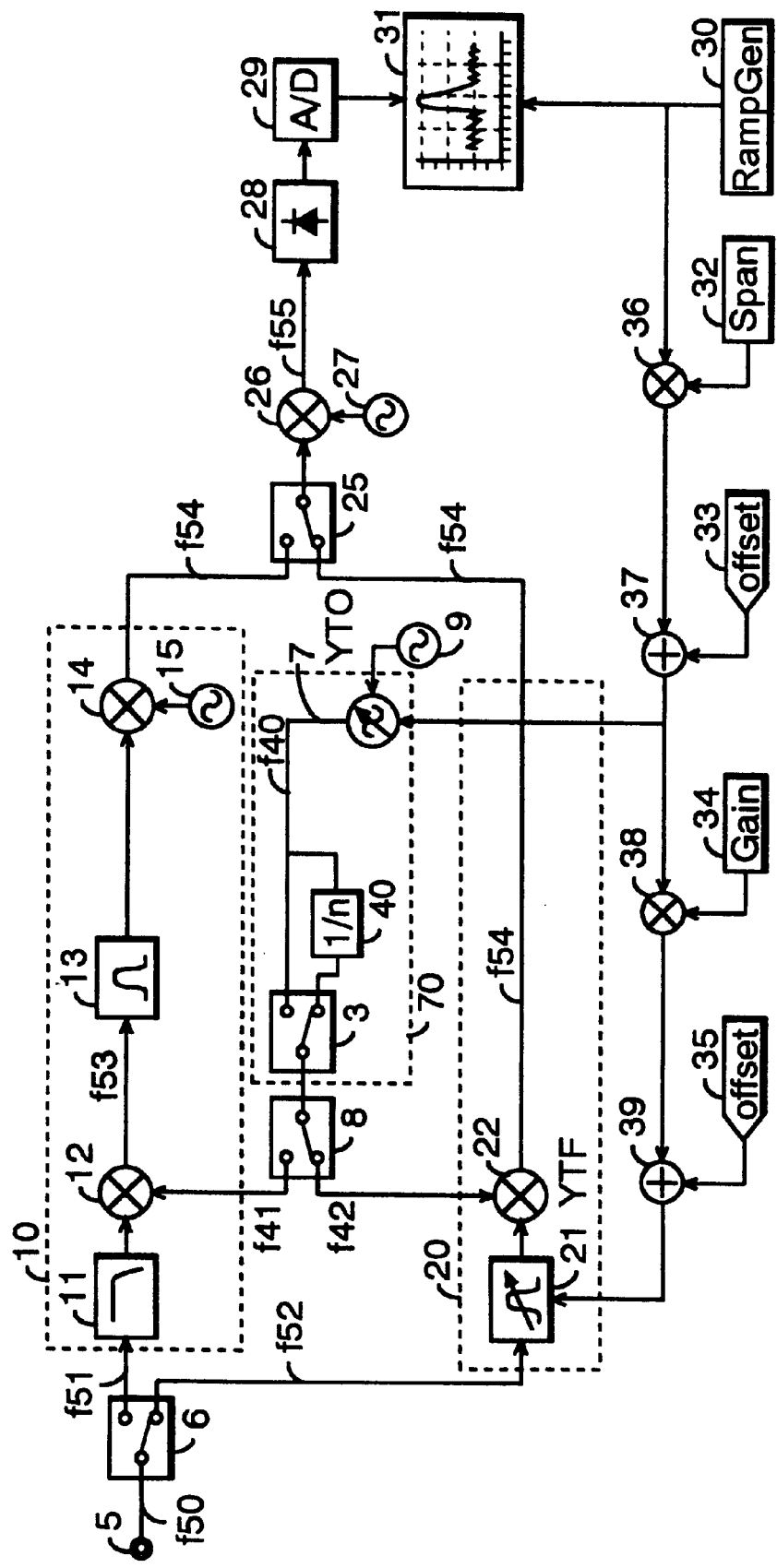
FIG. 5 is a block diagram showing another example of configuration in the spectrum analyzer of the present invention.

Such an example is shown in FIG. 5 wherein the local signal divider 70 includes a 1/n frequency divider for dividing the frequency of the first local signal by n before supplying to the frequency mixer 22 of the high band block 20. In the 1/n mode, the first local signal of 1/n frequency is provided to the frequency mixer 22 while in the other mode, the first local signal from the YTO 7 is directly provided to the frequency mixer 22.

As described above, in the spectrum analyzer of the present invention, the first local signal from the YTO is either directly provided to the first frequency mixer or frequency divided before being provided to the high band frequency mixer. By this arrangement, the local signal supplied to the first frequency mixer has a frequency band equivalent to the double octave band YTO with use of the signal octave band YTO.

According to the present invention, the spectrum analyzer is capable of improving the carrier to noise (C/N) ratio with use of a single octave YIG tuned oscillator (YTO) while decreasing the cost. Because of the improved C/N ratio, the spectrum analyzer of high dynamic range with low noise level is achieved. The noise level of the local signal is reduced by incorporating the single octave YTO and dividing the frequency of the YTO before being applied to the frequency mixer.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A spectrum analyzer for analyzing frequency spectrum in an input signal, comprising:

a first local oscillator comprised of a YIG tuned oscillator (YTO) for generating a first local signal which is swept in response to a ramp signal;

a base band block having a first frequency mixer for producing a first intermediate frequency (IF) signal by mixing the input signal to be analyzed with the first local signal and a second frequency mixer for producing a second IF signal by mixing the first IF signal with a second local signal;

a high band block having a frequency preselector comprised of a YIG tuned filter (YTF) for selecting frequency components in the input signal in response to the ramp signal, the high band block having a high band frequency mixer for producing the second IF signal by mixing the input signal through the YTF with the first local signal;

a local signal switch for selectively providing the first local signal to the first frequency mixer in the base band block or to the high band frequency mixer in the high band block; and a local signal mode switch having a pair of signal switches, one at an input of a frequency divider and the other at an output of the frequency divider, for either directly providing the first local signal to the high band frequency mixer or providing the first local signal to the high band frequency mixer through the frequency divider which divides the frequency of the first local signal by a predetermined division ratio;

wherein the YTO has a sweep frequency range which is 1/2 of a sweep frequency range of the YTF, and the division ratio of the frequency divider is two (2).

2. A spectrum analyzer for analyzing frequency spectrum in an input signal, comprising:

a first local oscillator comprised of a YIG tuned oscillator (YTO) for generating a first local signal which is swept in response to a ramp signal;

a high band block having a frequency preselector comprised of a YIG tuned filter (YTF) for selecting frequency components in the input signal in response to the ramp signal;

a high band frequency mixer provided in the high band block for producing an IF (intermediate frequency) signal by mixing the input signal through the YTF with the first local signal; and a local signal mode switch having a pair of signal switches, one at an input of a frequency divider and the other at an output of the frequency divider, for directly providing the first local signal to the high band frequency mixer or through the frequency divider which divides the first local signal frequency by a predetermined division ratio;

wherein the YTO has a sweep frequency range which is 1/2 of a sweep frequency range of the YTF, and the division ratio of the frequency divider is two (2).

3. A spectrum analyzer for analyzing frequency spectrum in an input signal, comprising:

a first local oscillator comprised of a YIG tuned oscillator (YTO) for generating a first local signal which is swept in response to a ramp signal;

a base band block having a first frequency mixer for producing a first intermediate frequency (IF) signal by mixing the input signal to be analyzed with the first local signal and a second frequency mixer for producing a second IF signal by mixing the first IF signal with a second local signal, the base band block also having a low pass filter for removing high frequency components in the input signal before being applied to the first frequency mixer;

a high band block having a frequency preselector comprised of a YIG tuned filter (YTF) for selecting frequency components in the input signal in response to the ramp signal, the high band block having a high band frequency mixer for producing the second IF signal by mixing the input signal through the YTF with the first local signal;

a local signal switch for selectively providing the first local signal to the base band block or to the high band block;

an IF signal switch for selectively transmitting the second IF signal either from the base band block or from the high band block; and a local signal mode switch having a pair of signal switches, one at an input of a frequency divider and the other at an output of the frequency divider, for either directly providing the first local signal to the high band frequency mixer or providing the first local signal to the high band frequency mixer through the frequency divider which divides the frequency of the first local signal by a predetermined division ratio;

wherein the YTO has a sweep frequency range which is 1/n of a sweep frequency range of the YTF, and the division ratio of the frequency divider is n.

* * * * *